US006734522B2

United States Patent
Maruyama

(10) Patent No.: US 6,734,522 B2
(45) Date of Patent: May 11, 2004

(54) TRANSISTOR

(75) Inventor: Yasuhiro Maruyama, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 31 days.

(21) Appl. No.: 09/895,082

(22) Filed: Jul. 2, 2001

(65) Prior Publication Data

US 2002/0011609 A1 Jan. 31, 2002

(30) Foreign Application Priority Data

Jul. 25, 2000 (JP) ........................................ 2000-224112

(51) Int. Cl.$^7$ ............................................. H01L 29/00
(52) U.S. Cl. ........................................ 257/503; 257/547
(58) Field of Search ................................. 257/503, 547

(56) References Cited

U.S. PATENT DOCUMENTS

| | | | | |
|---|---|---|---|---|
| 4,348,600 A | * | 9/1982 | Jarrett et al. ................... | 326/79 |
| 4,835,596 A | * | 5/1989 | Werner ......................... | 257/492 |
| 4,987,469 A | * | 1/1991 | Ludikhuize .................. | 257/378 |
| 5,422,299 A | * | 6/1995 | Neudeck et al. ............. | 438/360 |
| 5,559,044 A | * | 9/1996 | Williams et al. ............. | 438/234 |
| 5,604,359 A | * | 2/1997 | Naruse et al. ................ | 257/69 |
| 5,798,560 A | * | 8/1998 | Ohkawa et al. .............. | 257/555 |

FOREIGN PATENT DOCUMENTS

| | | | | | |
|---|---|---|---|---|---|
| DE | 3841777 A | * | 6/1990 | ......... | H01L/27/082 |
| JP | 58043560 A | * | 3/1983 | ........... | H01L/27/08 |
| JP | 58-137251 A | | 8/1983 | | |
| JP | 58-223345 A | | 12/1983 | | |
| JP | 60-35569 A | | 2/1985 | | |
| JP | 6025906 | | 6/1985 | | |
| JP | 62-265761 A | | 11/1987 | | |
| JP | 63-316453 A | | 12/1988 | | |
| JP | 2-260641 A | | 10/1990 | | |
| JP | 4-3431 A | | 1/1992 | | |
| JP | 5-121426 A | | 5/1993 | | |
| JP | 5275631 | | 10/1993 | | |
| JP | 6037120 | | 2/1994 | | |

* cited by examiner

Primary Examiner—George Eckert
Assistant Examiner—Paul E Brock, II
(74) Attorney, Agent, or Firm—Birch, Stewart, Kolasch & Birch, LLP

(57) ABSTRACT

A transistor includes an NPN transistor provided with an N-type emitter, a P-type base, an N-type collector, an emitter diffusion region and a collector compensation diffusion region around the base and the emitter for decreasing a saturation voltage and a parasitic PNP transistor in a region where the NPN transistor is formed, the parasitic PNP transistor operating under saturation of the NPN transistor.

3 Claims, 7 Drawing Sheets

TRANSISTOR

CROSS-REFERENCE TO RELATED APPLICATION

This application is related to Japanese Patent Application No. 2000-224112 filed on Jul. 25, 2000, whose priority is claimed under 35 USC § 119, the disclosure of which is incorporated by reference in its entirety.

BACKGROUND OF THE INVENTION

1. Field of the Invention

The present invention relates to a transistor such as a photocoupler or the like which has a saturation-level voltage when an output transistor is ON and in which the output transistor has a reduced turn-off time ($T_{OFF}$).

2. Description of Related Art

FIG. 5 shows an NPN transistor for a low saturation voltage output. In FIG. 5, the upper part and the lower part show a plan view and a sectional view, respectively, of the transistor. There are shown in the figure a substrate 1, a base 2, an emitter 3, a collector 4, an insulating film 5, a second emitter diffusion region 6, a base diffusion region 7, an epitaxial region 8, a collector compensation diffusion region 9, an buried diffusion region 10, an isolation diffusion region 11 and a first emitter diffusion region 12.

In designing the transistor, the specific resistance and thickness of the epitaxial region is so determined to endure the maximum voltage applied, and the area of the emitter is so determined to allow the maximum output current to flow. The collector compensation diffusion region is so arranged to encircle the base and the emitter for reducing a collector resistance and decreasing the saturation voltage with the determined area of the emitter.

Transistors such as a photocoupler may mal-operate in an environment where noise is large. For this reason, a grounded-emitter current gain (hFE) in a reverse direction needs to be raised. That is, the transistor is so designed that its base and emitter are enclosed by the collector compensation region and the buried diffusion region.

FIG. 7 illustrates a switching waveform when a pulse is input to the base of a prior art transistor. A current is supplied to the base so that an output Vc is saturated and is a sufficiently low voltage when the transistor is ON. However, when the saturation becomes deep, the transistor turns OFF and a turn-off time ($t_{OFF}$) is prolonged which is necessary for the potential of the collector to change from low to high.

The $t_{OFF}$ is the sum of a falling time (tf) in which Vc changes from 10% to 90% and a storage time (ts) from the moment when the input pulse to the base is cut until the moment when Vc becomes 10%.

When the saturation becomes deep, ts of $t_{OFF}$ becomes large. This results from the remaining of carriers stored in an ON state. In the On state, the transistor operates in a saturation region, and a collector junction is in a forward bias state and carriers are injected thereto. Thereby, in the epitaxial region enclosed by the base region, the collector, the buried diffusion region (N+) and the collector compensation diffusion region (N+), an excess minority carrier deposit more than in an active state. After the input pulse is ceased and the polarity of voltage input to the base is reversed, the excess minority carrier remains during the Ts period. The excess minority carrier recombines or is removed from the base by an inverse base current Ibr, and the collector junction becomes into an inverse bias state. Then the current to the collector begins to decrease. When the minority carrier decreases further and the excess carrier disappears, the transistor is turned off.

The storage time ts is represented by the following formula:

$$ts = \tau_p \ln(\beta_F I_B / I_C),$$

wherein $\tau_p$: the life of the minority carrier in the base region, $\beta_F$: grounded-emitter current-amplification factor.

Here, in the case where $\beta_F$ is intended to be decreased for reducing ts, $\beta_F$ is determined by the maximum current output by the transistor in combination with the emitter area. In the case where $\tau_p$ is intended to be reduced, the amount of the minority carrier injected in the epitaxial region may be reduced. For this purpose, the area of the epitaxial region may be reduced or the thickness thereof may be reduced. However, the area of the epitaxial region is almost determined by the above-mentioned area of the emitter. The specific resistance and the thickness of the epitaxial region are so determined to endure the maximum voltage applied to the transistor.

SUMMARY OF THE INVENTION

In order to solve the above-described problems, the inventor of the present invention has directed his attention to the reduction of $\tau_p$. That is, $\tau_p$ is reduced by drawing out the minority carrier injected excessively in the base and the epitaxial region. More particularly, a parasitic PNP transistor is provided in the transistor, and at the deep saturation, the parasitic PNP transistor operates to draw the minority carrier from the base to reduce ts. Consequently, $\tau_p$ can be decreased.

Thus, according to the present invention, there is provided a transistor comprising an NPN transistor provided with an N-type emitter, a P-type base, an N-type collector, an emitter diffusion region and a collector compensation diffusion region around the base and the emitter for decreasing a saturation voltage; and a parasitic PNP transistor in a region where the NPN transistor is formed, the parasitic PNP transistor operating under saturation of the NPN transistor.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The present invention is now described in detail by way of embodiments thereof with reference to the attached drawings.

First Embodiment

Figure 1:
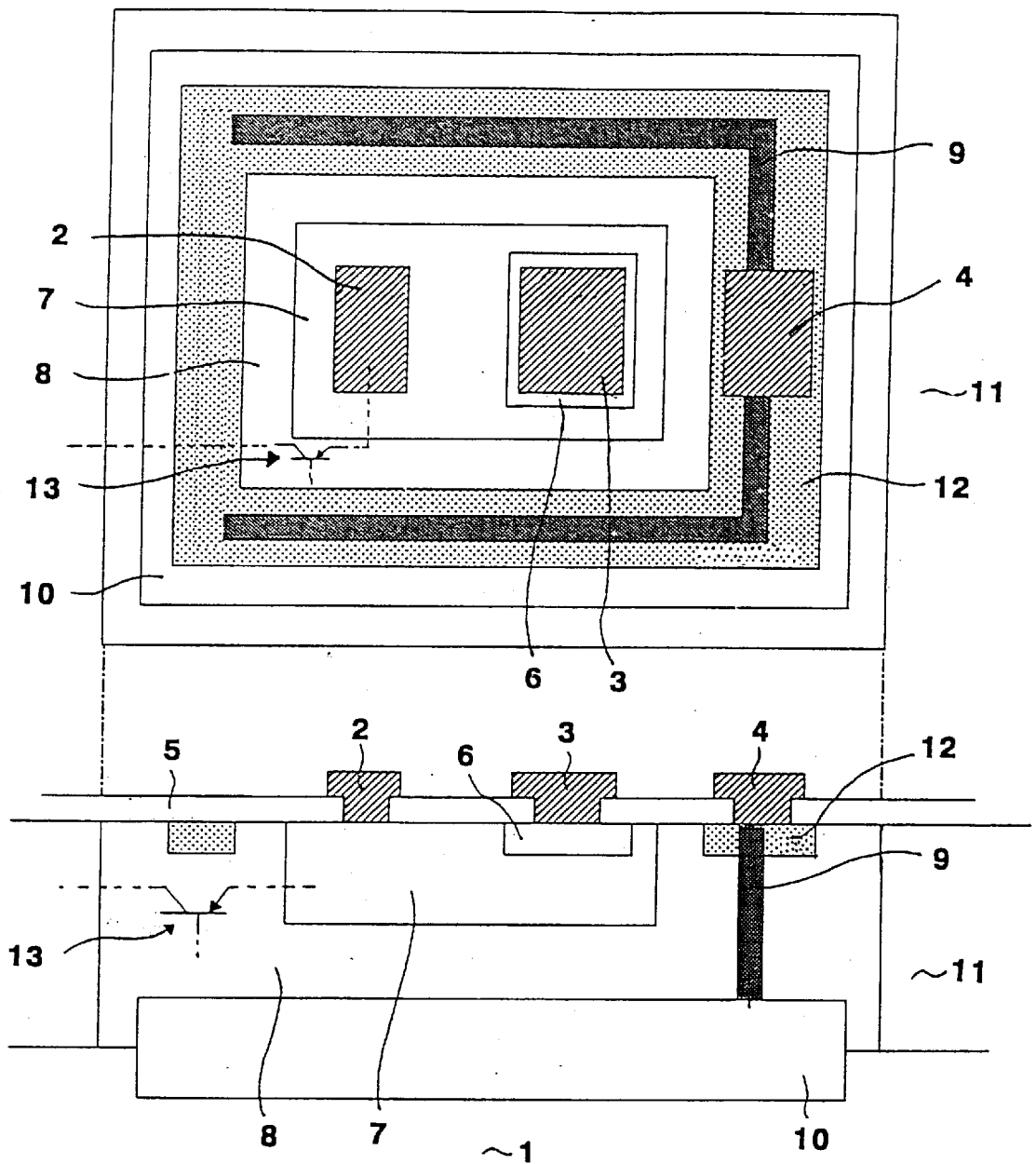
FIG. 1 shows a schematic plan view and a sectional view of a transistor in accordance with the present invention.

FIG. 1 illustrates one embodiment according to the present invention, showing a plan view in the upper part and a sectional view in the lower part. In the figure, there are shown a substrate 1, a P-type base 2, an N-type emitter 3, an N-type collector 4, an insulating film 5, a second emitter diffusion region 6, a base diffusion region 7, an epitaxial region 8, a collector compensation diffusion region 9, a buried diffusion region 10, an isolation diffusion region 11 for isolating the transistor from the surroundings, a first emitter diffusion 12 and a parasitic PNP transistor 13.

As seen in FIG. 1, for reducing the saturation voltage ($V_{CEsat}$) and raising the reverse hFE, in the NPN transistor having the base (B) and the emitter (E) encircled by the first emitter diffusion region and provided with the collector compensation diffusion region (NC) around the base and the emitter and the buried diffusion region between the P-type substrate and the epitaxial region, the collector compensation diffusion region (NC) is arranged in the U-shape and the parasitic PNP transistor is composed of the base (P-), the epitaxial region (N) and the isolation diffusion region (P), the parasitic PNP transistor operating when the NPN transistor composed of the above base, emitter and collector compensation diffusion region is saturated.

Since the emitter of the parasitic PNP transistor is the base of the NPN transistor, the potential of the emitter of the parasitic PNP transistor is the same as that of the base of the NPN transistor when the NPN transistor operates (e.g., 0.7 V). Since the collector of the parasitic PNP transistor is the isolation diffusion region, its potential is GND.

The base of the parasitic PNP transistor is the epitaxial region, and its potential is the same as that of the collector of the NPN transistor. Accordingly, when the potential of the collector of the NPN transistor is not deeply saturated ($V_B<V_C$), the parasitic PNP transistor is reversely biased and does not operate. When the potential of the collector of the NPN transistor is deeply saturated ($V_B>V_C$), the parasitic PNP transistor is forwardly biased and operates to draw the over-injected minority carrier from the base. Consequently the storage time of the NPN transistor can be shortened.

Since the collector compensation diffusion region (NC) and the buried diffusion region function to reduce a collector resistance of the transistor, it is preferable to reduce the influence on a forward-direction operation of the NPN transistor as much as possible where the collector compensation diffusion region (NC) is arranged in the U-shape. If the collector resistance becomes too large, a sufficiently low saturation voltage may not be obtained even when the NPN transistor is in the deep saturation. Since the emitter (P) of the parasitic PNP transistor which operates under saturation draws the over-injected minority carrier from the base (P) of the NPN transistor, it is preferably disposed near the base where the collector compensation diffusion region (NC) does not exist. In FIG. 1, the collector compensation diffusion region is disposed immediately under a collector terminal and the emitter of the parasitic PNP transistor is disposed to a base side where the collector compensation diffusion region is not present so that the collector resistance does not increase. For this reason, the parasitic PNP transistor can easily operate.

Second Embodiment

Figure 2:
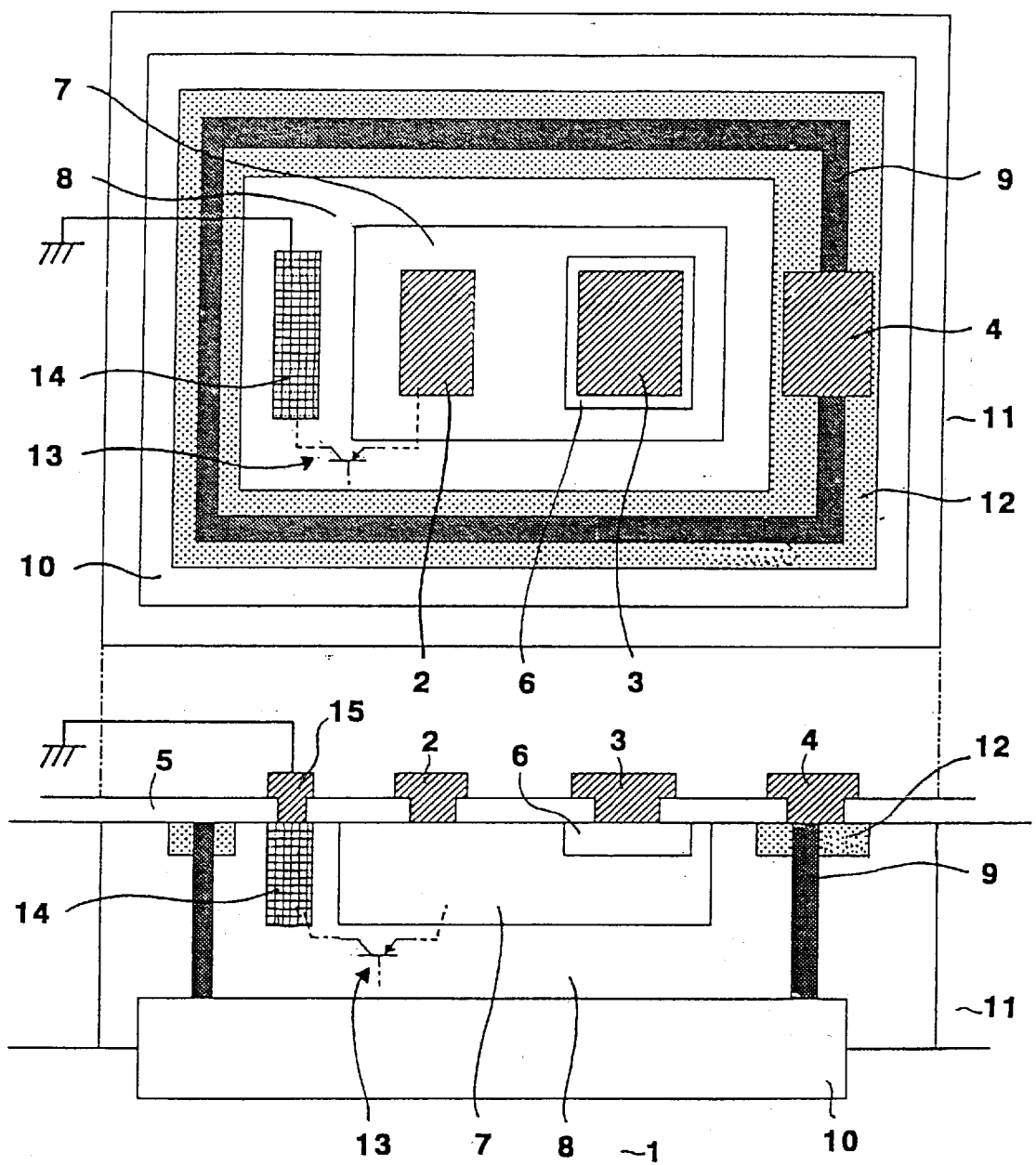
FIG. 2 shows a schematic plan view and a sectional view of a transistor in accordance with the present invention.

FIG. 2 illustrates one embodiment according to the present invention, showing a plan view in the upper part and a sectional view in the lower part. In the figure, there are shown a P-type semiconductor layer 14 and an electrode 15.

As seen in FIG. 2, for reducing the saturation voltage (VCEsat) and raising the reverse hFE, in an NPN transistor having a P-type base (B) and an N-type emitter (E) enclosed by a first emitter diffusion region, a collector compensation diffusion region (NC) and a buried diffusion region, the P-type semiconductor layer is formed in an epitaxial region encircled by the collector compensation diffusion region (NC) and the buried diffusion region and is set at a GND potential. The parasitic PNP transistor is composed of the base (P-), the epitaxial region (N) and the P-type semiconductor layer (P) on the epitaxial region, the parasitic PNP transistor operating when the NPN transistor composed of the above base, emitter and collector compensation diffusion region is saturated. Since the emitter of the parasitic PNP transistor is the base of the NPN transistor, the potential of the emitter of the parasitic PNP transistor is the same as that of the base of the NPN transistor when the NPN transistor operates (e.g., 0.7 V).

Since the collector of the parasitic PNP transistor is the epitaxial region and its potential is the same as that of the collector of the NPN transistor, the parasitic PNP transistor is reversely biased and does not operate when the potential of the collector of the NPN transistor is not deeply saturated ($V_B<V_C$). When the potential of the collector of the NPN transistor is deeply saturated ($V_B>V_C$), the parasitic PNP transistor is forwardly biased and operates to draw the over-injected minority carrier from the base. Consequently the storage time of the NPN transistor can be shortened.

In the case where the P-type semiconductor layer is formed in the epitaxial region encircled by the collector compensation diffusion region (NC), it is preferable to reduce the influence on the forward-direction operation of the NPN transistor as much as possible. Since the emitter (P) of the parasitic PNP transistor which operates under saturation draws the over-injected minority carrier from the base (P) of the NPN transistor, the P-type semiconductor layer is located near the base in the embodiment shown in FIG. 2.

Third Embodiment

Figure 3:
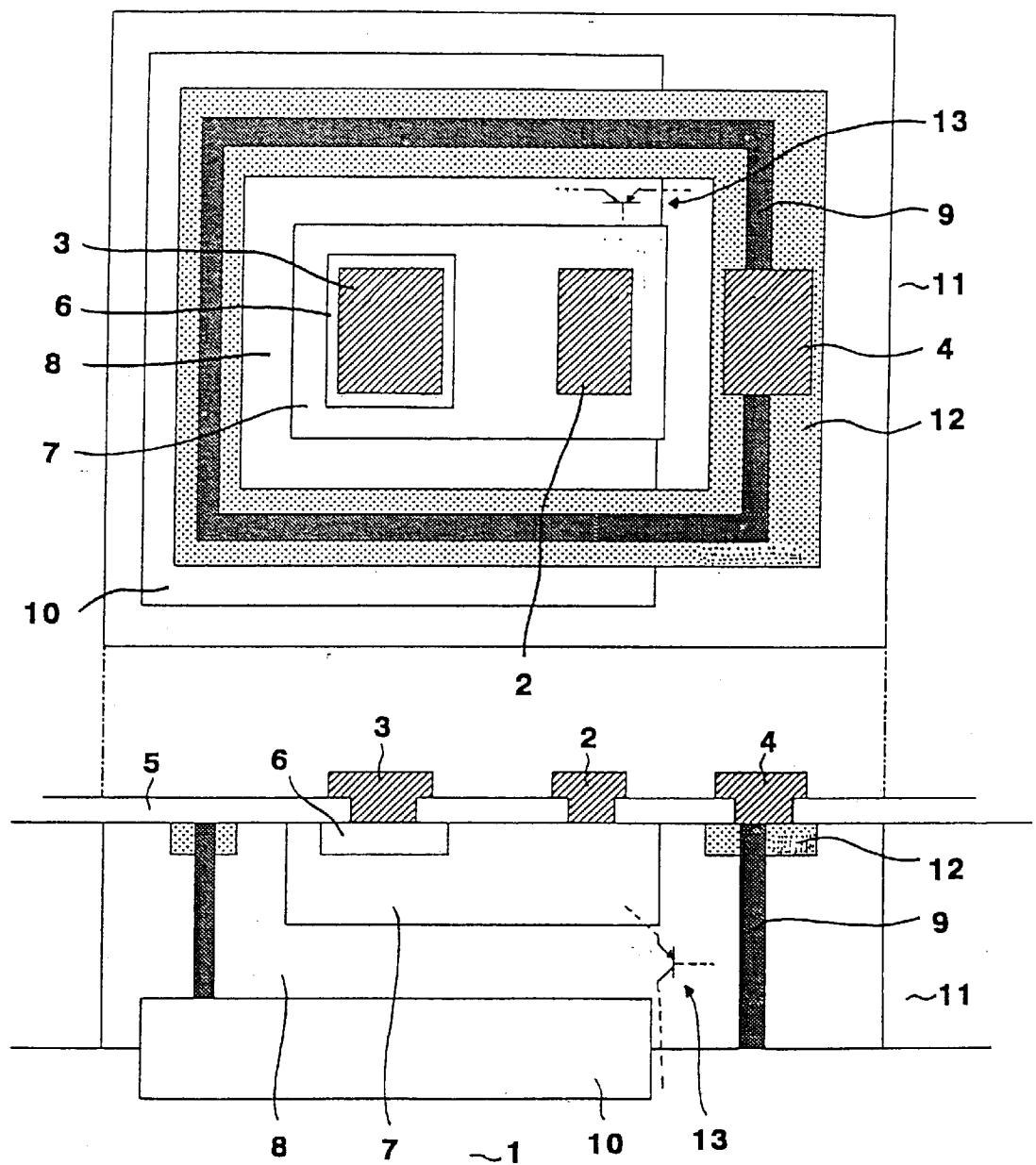
FIG. 3 shows a schematic plan view and a sectional view of a transistor in accordance with the present invention.

FIG. 3 illustrates one embodiment according to the present invention, showing a plan view in the upper part and a sectional view in the lower part.

As seen in FIG. 3, for reducing the saturation voltage ($V_{CEsat}$) and raising the reverse hFE, in an NPN transistor having a base (B) and an emitter (E) enclosed by a first emitter diffusion region, a collector compensation diffusion region (NC) and a buried diffusion region, a portion of the buried diffusion region is cut and the epitaxial region directly contacts a substrate in the portion. The parasitic PNP transistor is composed of the base (P-), the epitaxial region (N) and the substrate (P), the parasitic PNP transistor operating when the NPN transistor composed of the above base, emitter and collector compensation diffusion region is saturated.

Since the emitter of the parasitic PNP transistor is the base of the NPN transistor, the potential of the emitter of the parasitic PNP transistor is the same as that of the base of the NPN transistor when the NPN transistor operates (e.g., 0.7 V). Since the collector of the parasitic PNP transistor is the substrate, its potential is GND.

Since the base of the parasitic PNP transistor is the epitaxial region and its potential is the same as that of the collector of the NPN transistor, the parasitic PNP transistor is reversely biased and does not operate when the potential of the collector of the NPN transistor is not deeply saturated ($V_B < V_C$). When the potential of the collector of the NPN transistor is deeply saturated ($V_B > V_C$), the parasitic PNP transistor is forwardly biased and operates to draw the over-injected minority carrier from the base. Consequently the storage time of the NPN transistor can be shortened.

Since the collector compensation diffusion region (NC) and the buried diffusion region function to reduce the collector resistance of the transistor, it is preferable to reduce the influence on the forward-direction operation of the NPN transistor as much as possible where the buried diffusion region is cut in the portion, where the epitaxial region contacts the substrate. If the collector resistance becomes too large, a sufficiently low saturation voltage may not be obtained even when the NPN transistor is under the deep saturation. Since the emitter (P) of the parasitic PNP transistor which operates under saturation draws the over-injected minority carrier from the base (P) of the NPN transistor, it is preferable to locate the portion where the epitaxial region contacts the substrate near the base.

In the embodiment shown in FIG. 3, the collector compensation diffusion region is disposed immediately under the collector and the buried diffusion region is disposed immediately under the emitter so that the collector resistance does not increase. Therefore, the parasitic PNP transistor can easily operate.

Figure 6:
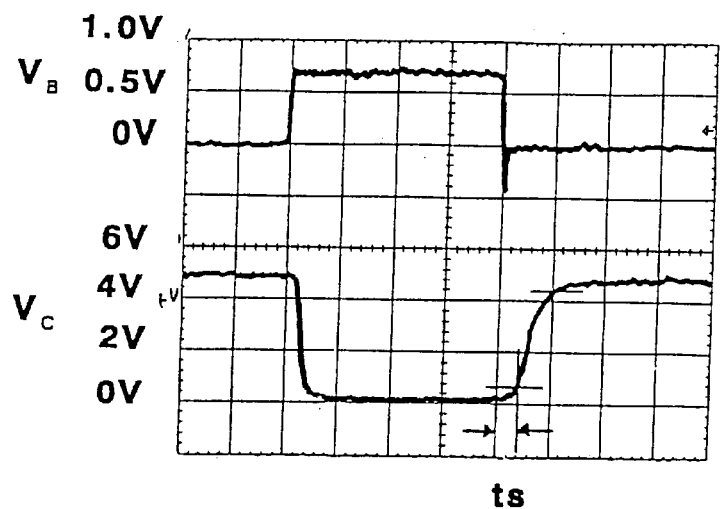
FIGS. 6(1) to 6(3) are graphical representations showing switching waveforms of transistors in accordance with First to Third embodiments.
Figure 6:
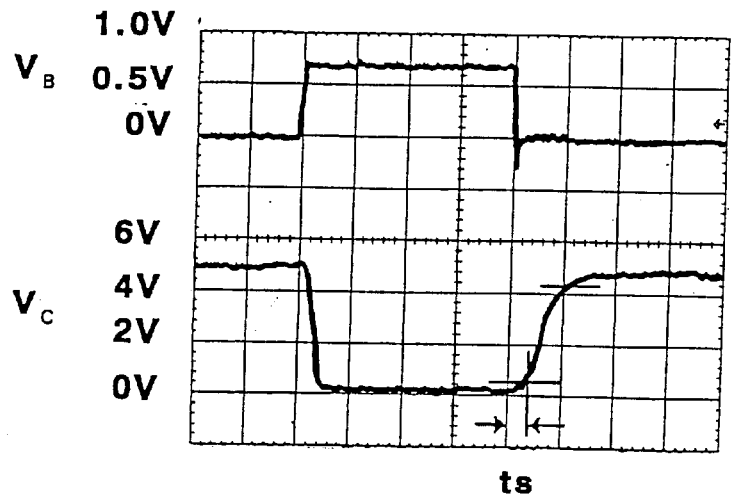
Figure 6:
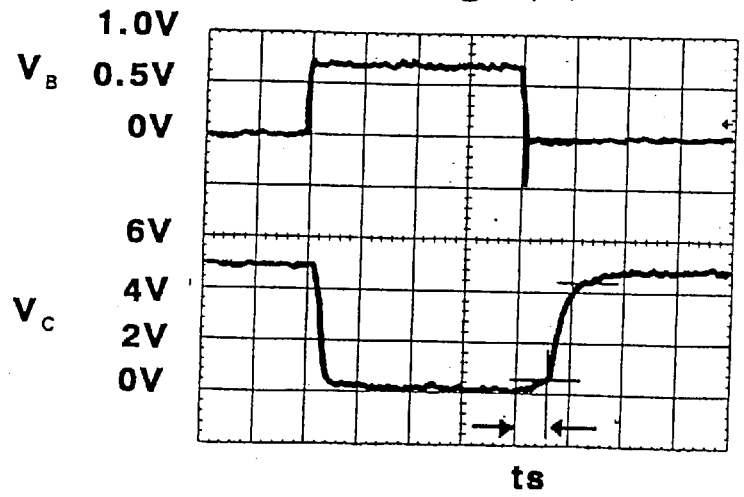
Figure 7:
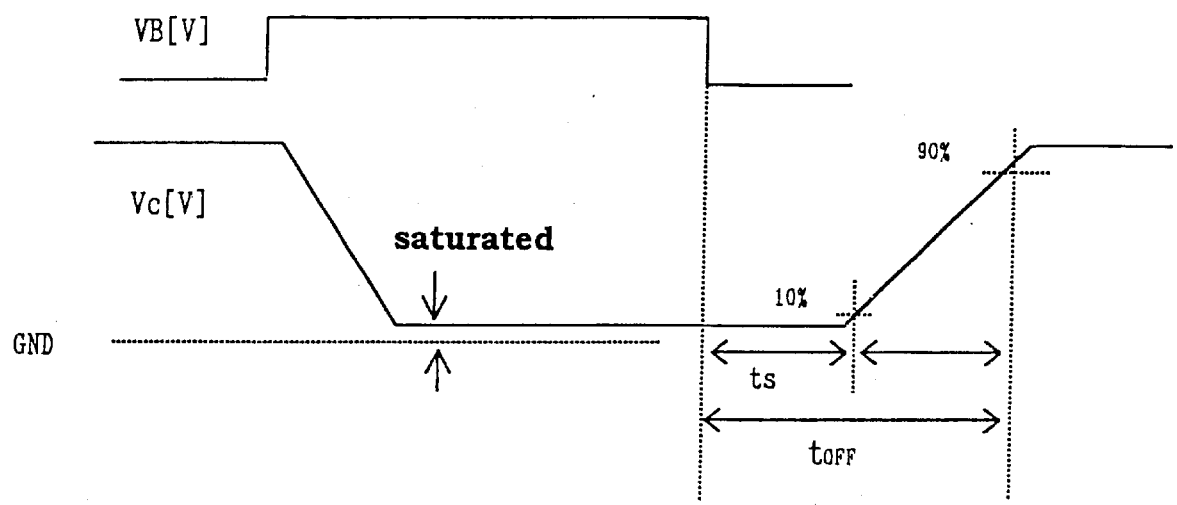
FIG. 7 illustrates a relationship of ts, tf and $T_{OFF}$ of a transistor.
Figure 8:
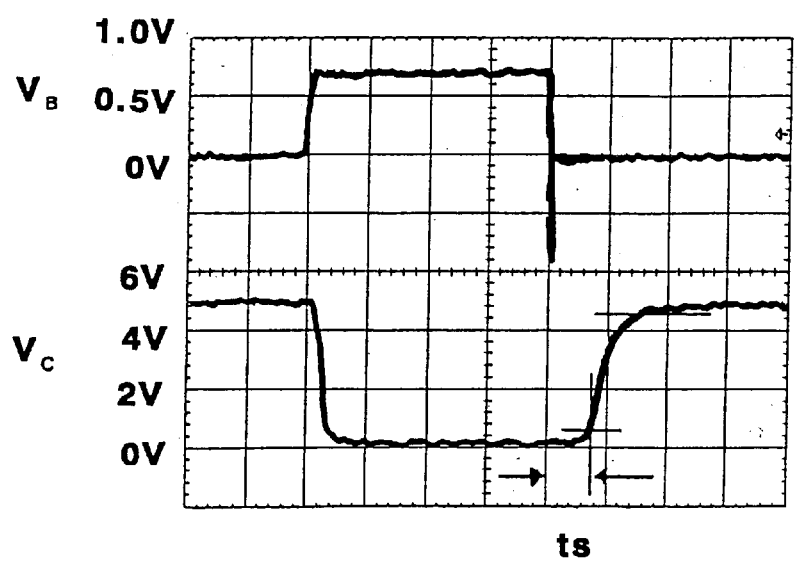
FIG. 8 is a graphical representation showing a switching waveform of a prior art transistor.

FIGS. 6(1) to 6(3) show switching waveforms of the transistors actually made according to the First to Third Embodiments and FIG. 8 shows a switching waveform of the prior art transistor. Conditions such as the area of the emitter, the current applied to the base and the like are the same in all the cases. The storage time (ts) of the transistors of the First to Third Embodiments is shorter than that of the prior art transistor.

Fourth Embodiment

In actual production of the transistor, variations in alignment of the photomask and variations in diffusion occur in the process of forming the buried diffusion region and also occur in the process of forming the collector compensation diffusion region. Thus, in the case of FIG. 3, variations in the photomask alignment and in diffusion sum up to several micrometers at the worst between the buried diffusion region and the collector compensation diffusion region.

Figure 4:
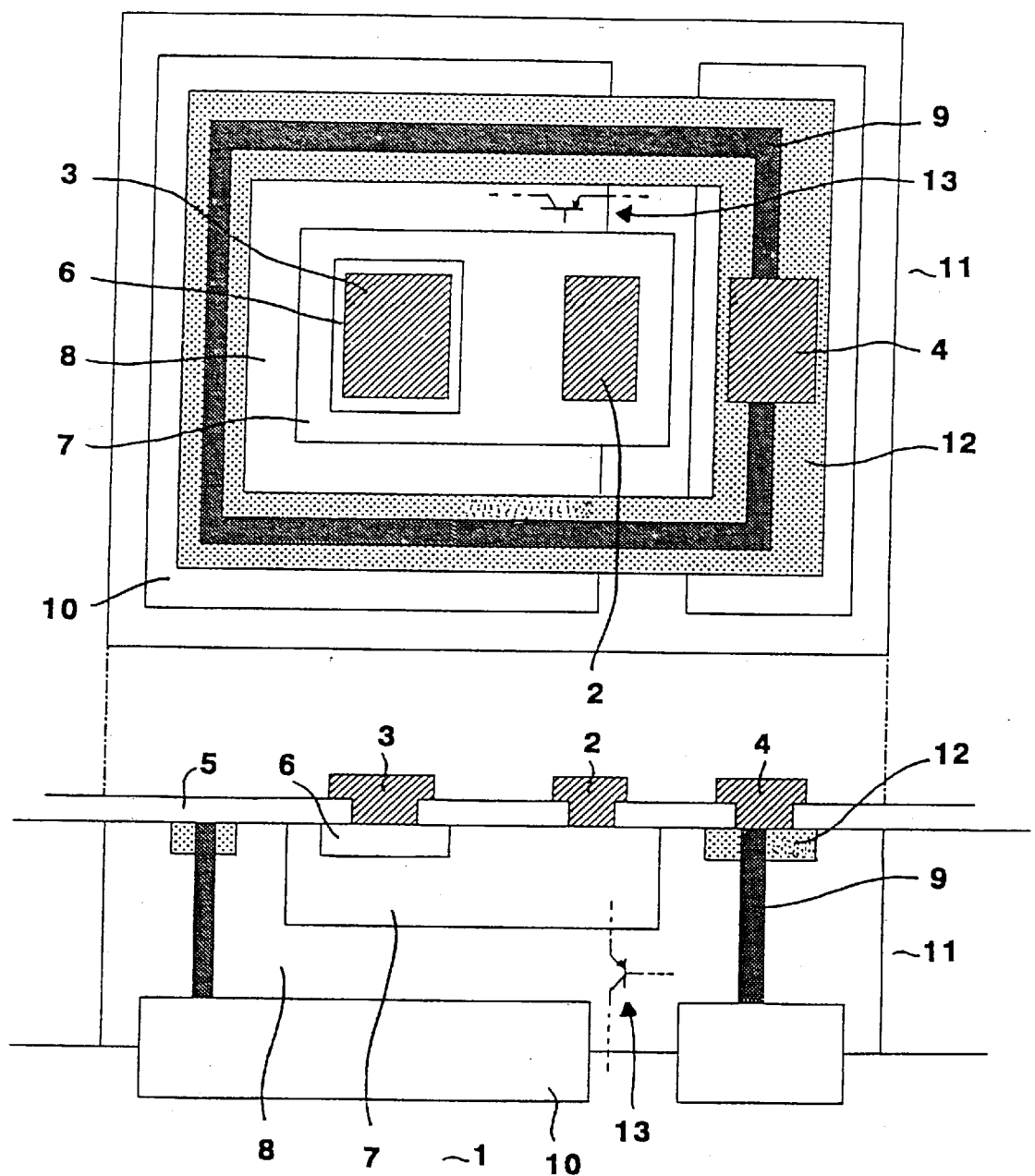
FIG. 4 shows a schematic plan view and a sectional view of a transistor in accordance with the present invention.
Figure 5:
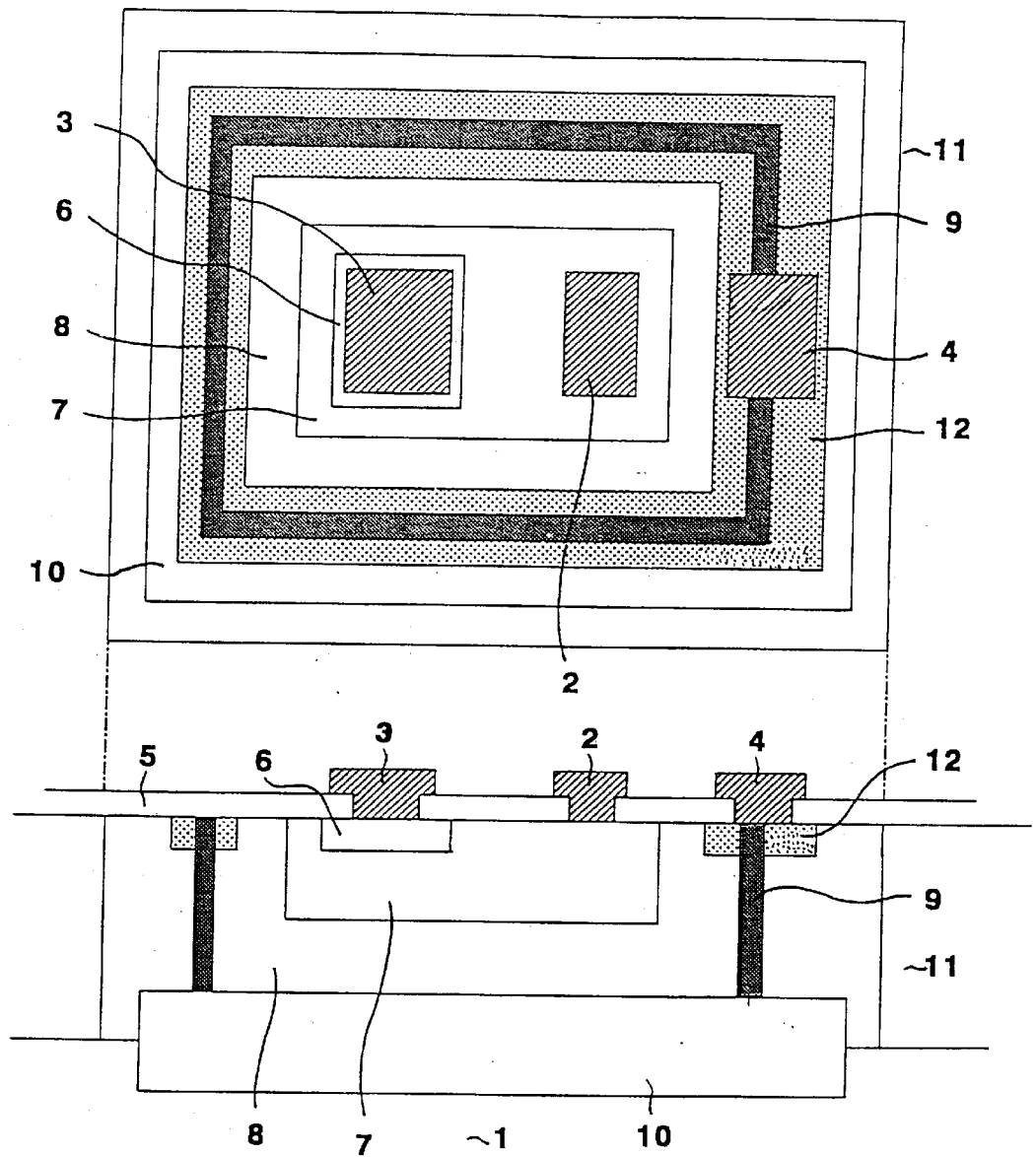
FIG. 5 shows a schematic plan view and a sectional view of a prior art transistor.

In an embodiment shown in FIG. 4, a buried diffusion region is inserted to contact the collector compensation diffusion region, and a portion where the epitaxial region contacts the substrate is formed in such a manner that the buried diffusion region has an opening. Preferably, the buried diffusion region inserted to contact the collector compensation diffusion region has a size larger than the sum of a variation in the alignment of the photomask between the buried diffusion region and the collector compensation diffusion region and a variation in diffusion in the production of the collector compensation diffusion region. Thereby, variation in diffusion in the production of the buried diffusion region can be regarded as the only variation between the buried diffusion region and the collector compensation diffusion region. This is about half or less of the variations in the embodiment of FIG. 3.

According to the present invention, the storage time can be reduced without a reduction in the forward hFE or without an increase in the saturation voltage even if the transistor has the same area for the emitter as that of the prior art transistor.

What is claimed is:

1. A transistor comprising:

an NPN transistor provided with an N-type emitter, a P-type base, and N-type collector, an emitter diffusion region and a collector compensation diffusion region around the base and the emitter for decreasing a saturation voltage; and a parasitic PNP transistor in a region where the NPN transistor is formed, the parasitic PNP transistor operating under saturation of the NPN transistor, wherein the collector compensation diffusion region is arranged to encircle the base and the emitter, a buried diffusion region is provided under the base and the emitter, said buried diffusion region having an opening, and a portion of an N-type epitaxial region directly contacts a P-type substrate at the opening, the portion of the epitaxial region directly contacting the P-type substrate is located between the base and the collector compensating diffusion region.

2. A transistor according to claim 1, wherein a portion of said buried diffusion region is provided under and in contact with the collector compensation diffusion region, and the parasitic PNP transistor is composed of the P-type base, the N-type epitaxial region and the P-type substrate in the direct contact with the epitaxial region.

3. A transistor according to claim 2, wherein the collector compensation diffusion region, exist immediately under the collector.

* * * * *